United States Patent
No et al.

(10) Patent No.: US 8,397,116 B2
(45) Date of Patent: Mar. 12, 2013

(54) DECODING METHOD AND MEMORY SYSTEM DEVICE USING THE SAME

(75) Inventors: Jong-seon No, Seoul (KR); Beom-kyu Shin, Seoul (KR); Ho-sung Park, Seoul (KR); Yong-june Kim, Seoul (KR); Jae-hong Kim, Seoul (KR); Young-hwan Lee, Suwon-si (KR); Jun-jin Kong, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 505 days.

(21) Appl. No.: 12/652,768

(22) Filed: Jan. 6, 2010

(65) Prior Publication Data

US 2010/0174959 A1    Jul. 8, 2010

(30) Foreign Application Priority Data

Jan. 6, 2009   (KR) .......................... 2009-00000842

(51) Int. Cl.
*H03M 13/00*    (2006.01)

(52) U.S. Cl. ...................................................... 714/746
(58) Field of Classification Search ................... 714/746
See application file for complete search history.

(56) References Cited

U.S. PATENT DOCUMENTS

2009/0307566 A1 *  12/2009  No et al. ..................... 714/784
2010/0088575 A1 *  4/2010   Sharon et al. ................ 714/763

* cited by examiner

*Primary Examiner* — Amine Riad
(74) *Attorney, Agent, or Firm* — Volentine & Whitt, PLLC

(57) ABSTRACT

A decoding method includes performing a first decoding method and performing a second decoding method when decoding of the first decoding method fails. The first decoding method includes updating multiple variable nodes and multiple check nodes using probability values of received data. The second decoding method includes selecting at least one variable node from among the multiple variable nodes; correcting probability values of data received in the selected at least one variable node; updating the variable nodes and the check nodes using the corrected probability values; and determining whether decoding of the second decoding method is successful.

9 Claims, 5 Drawing Sheets

FIG. 4

| NUMBER OF TIMES OF UPDATING | NUMBER OF UNSATISFIED CHECK NODES | UNSATISFIED CHECK NODES |
| --- | --- | --- |
| 1 | 3 | C1, C2, C3 |
| 2 | 3 | C1, C2, C3 |
| 3 | 1 | C1 |
| 4 | 2 | C1, C2 |
| 5 | 2 | C2, C3 |
| 6 | 3 | C1, C2, C3 |
| 7 | 2 | C1, C3 |
| 8 | 1 | C3 |
| 9 | 2 | C2, C3 |
| 10 | 2 | C1, C3 |

DECODING METHOD AND MEMORY SYSTEM DEVICE USING THE SAME

CROSS-REFERENCE TO RELATED APPLICATION

A claim of priority is made to Korean Patent Application No. 10-2009-0000842, filed on Jan. 6, 2009, in the Korean Intellectual Property Office, the subject matter of which is hereby incorporated by reference.

BACKGROUND

The inventive concept relates to a decoding method and a memory system device using the decoding method, and more particularly, to a decoding method that is efficient in iterative decoding and a memory system device using the decoding method.

In general, errors may occur in a digital communication system due to noise in a transmission line, etc. In order to remove the errors, the errors are corrected using various methods, such as a convolutional code, a turbo code, a low density parity check code (LDPC) code, a repeat accumulate (RA) code, and a zigzag code. From among these codes, iterative decoding is used in the turbo code, the LDPC code, the RA code, and the zigzag code.

SUMMARY

According to an aspect of the inventive concept, there is provided a decoding method including performing a first decoding method and performing a second decoding method, when the decoding of the first decoding method fails. The first decoding method includes updating multiple variable nodes and multiple check nodes using probability values of received data. The second decoding method includes selecting at least one variable node from among the multiple variable nodes; correcting probability values of data received in the selected at least one variable node; updating the variable nodes and the check nodes using the corrected probability values; and determining whether decoding of the second decoding method is successful.

The selecting of the at least one variable node may include counting the number of unsatisfied check nodes at each update time, when the updating is performed multiple times; and selecting the at least one variable node from among the variable nodes connected to unsatisfied check nodes corresponding to at least one update time having the minimum counted number of unsatisfied check nodes.

The selecting of the at least one variable node from among the variable nodes connected to the unsatisfied checks nodes may include selecting the variable nodes connected to all of the unsatisfied check nodes corresponding to all of the update times having the minimum counted number of unsatisfied check nodes.

The selecting of the at least one variable node from among the variable nodes connected to the unsatisfied checks nodes may include selecting the variable nodes commonly connected to the unsatisfied check nodes corresponding to the update times having the minimum counted number of unsatisfied check nodes.

The selecting of the at the least one variable node from among the variable nodes connected to the unsatisfied checks nodes may include selecting the variable nodes connected to the unsatisfied check nodes corresponding to the update times having the minimum counted number of unsatisfied check nodes for more than a predetermined number of times.

The selecting of the at least one variable node from among the variable nodes connected to the unsatisfied checks nodes may include the variable nodes connected to all of the unsatisfied check nodes corresponding to the last update time from among the update times having the minimum counted number of unsatisfied check nodes.

The selecting of the at least one variable node may include determining the number of times when signs of the probability values of each of the variable nodes are changed or determining the number of times when the signs of the probability values of each of the variable nodes are different from the signs of the probability values of received data. Then, i (where i is a natural number) variable nodes are selected having the highest number of times, or the variable nodes are selected where the number of times is more than a predetermined value.

The selecting of the at least one variable node may include selecting the variable nodes having probability values of received data that are within a predetermined range.

The correcting of the probability values may include at least one of changing signs of the probability values of the selected variable nodes and changing sizes of the probability values of the selected variable nodes.

According to another aspect of the inventive concept, there is provided a memory system device including a memory device and a memory controller for decoding data read from the memory device by using the decoding method above.

BRIEF DESCRIPTION OF THE DRAWINGS

The embodiments of the present inventive concept will be described with reference to the attached drawings, in which:

FIG. 4 is a representative table illustrating a result obtained by performing a first decoding method illustrated in FIG. 1;

DETAILED DESCRIPTION OF THE EMBODIMENTS

Figure 1:
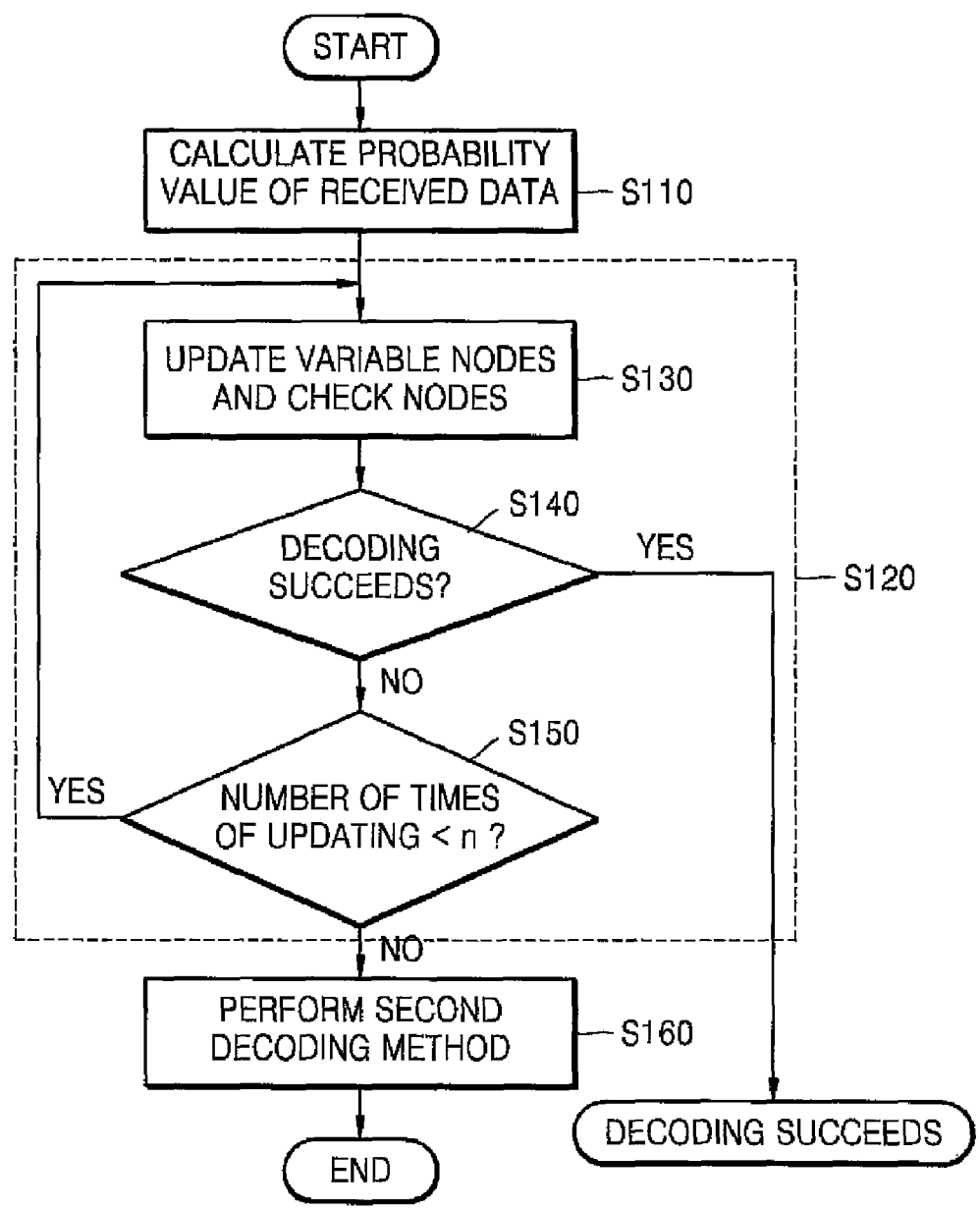
FIG. 1 is a flowchart illustrating a decoding method, according to an embodiment of the inventive concept.

The present inventive concept will now be described more fully with reference to the accompanying drawings, in which exemplary embodiments of the inventive concept are shown. The inventive concept, however, may be embodied in various different forms, and should not be construed as being limited only to the illustrated embodiments. Rather, these embodiments are provided as examples, to convey the inventive concept to one skilled in the art. Accordingly, known processes, elements, and techniques are not described with respect to some of the embodiments.

Hereinafter, embodiments of the inventive concept will be described more fully with reference to the accompanying drawings. Throughout the drawings and written description, like reference numerals will be used to refer to like or similar elements.

FIG. 1 is a flowchart illustrating a decoding method, according to an embodiment of the inventive concept.

Referring to FIG. 1, the decoding method according to the current embodiment includes performing a first decoding method in operation S120 and performing a second decoding method in operation S160, wherein the first decoding method is performed using probability values of received data and the second decoding method is performed when the first decoding method fails. Performing the first decoding method in operation S120 is described with reference to FIG. 1, and performing of the second decoding method in operation S160 is described with reference to FIG. 2.

When data is received, probability value(s) of the received data are calculated in operation S110. In order to calculate the probability values, a log-likelihood ratio (LLR) or a likelihood ratio (LR) may be used, for example. However, the inventive concept is not limited to the LLR or the LR to calculate the probability values, and other methods may be used to calculate the probability values of the received data.

After the probability values of the received data are calculated, variable nodes and check nodes are updated in operation S130 using the calculated probability values. For example, when the variable nodes are updated, the probability values of the received data and the probability values of the related check nodes are used. Also, when the check nodes are updated, the probability values of the variable nodes are used.

The variable nodes and the check nodes may be updated using various algorithms, such as a sum-product decoding algorithm, a min-sum decoding algorithm, or a bit-flipping decoding algorithm, for example. However, the inventive concept is not limited to these types of algorithms to update the variable nodes and the check nodes, and other algorithms may be used to update the variable nodes and the check nodes.

After the variable nodes and the check nodes are updated, it is determined in operation S140 whether the decoding is successful. When it is determined that the decoding has succeeded, there is no need to perform further decoding and thus the decoding operation is completed. Otherwise, when it is determined that the decoding has failed, it is determined in operation S150 whether the updating has been performed n times (where n is a natural number). For example, if n is 50, it is determined whether the number of times the variable nodes and check nodes have been updated is less than 50, thus the updating is repeated one time less than 50. When it is determined that the updating has been performed less than n times, the process returns to operation S130. When it is determined that the updating has been performed n times, the process continues to operation S160 for performing the second decoding method. That is, when the decoding of the first decoding method succeeds before the variable nodes and the check nodes have been updated n times, the decoding is completed. When the decoding fails, even after the variable nodes and the check nodes have been updated n times, operation S160 is performed. As described above, determining whether the decoding is successful while repeatedly updating of the variable nodes and the check nodes, as needed, denotes iterative decoding.

Hereinafter, the case when the decoding fails, even when the variable nodes and the check nodes are updated n times during the first decoding method in operation S120, is described. In this case, it is determined that the decoding has not succeeded, and thus the second decoding method is performed in operation S160. The performing of the second decoding method in operation S160 is described with reference to FIG. 2.

Figure 2:
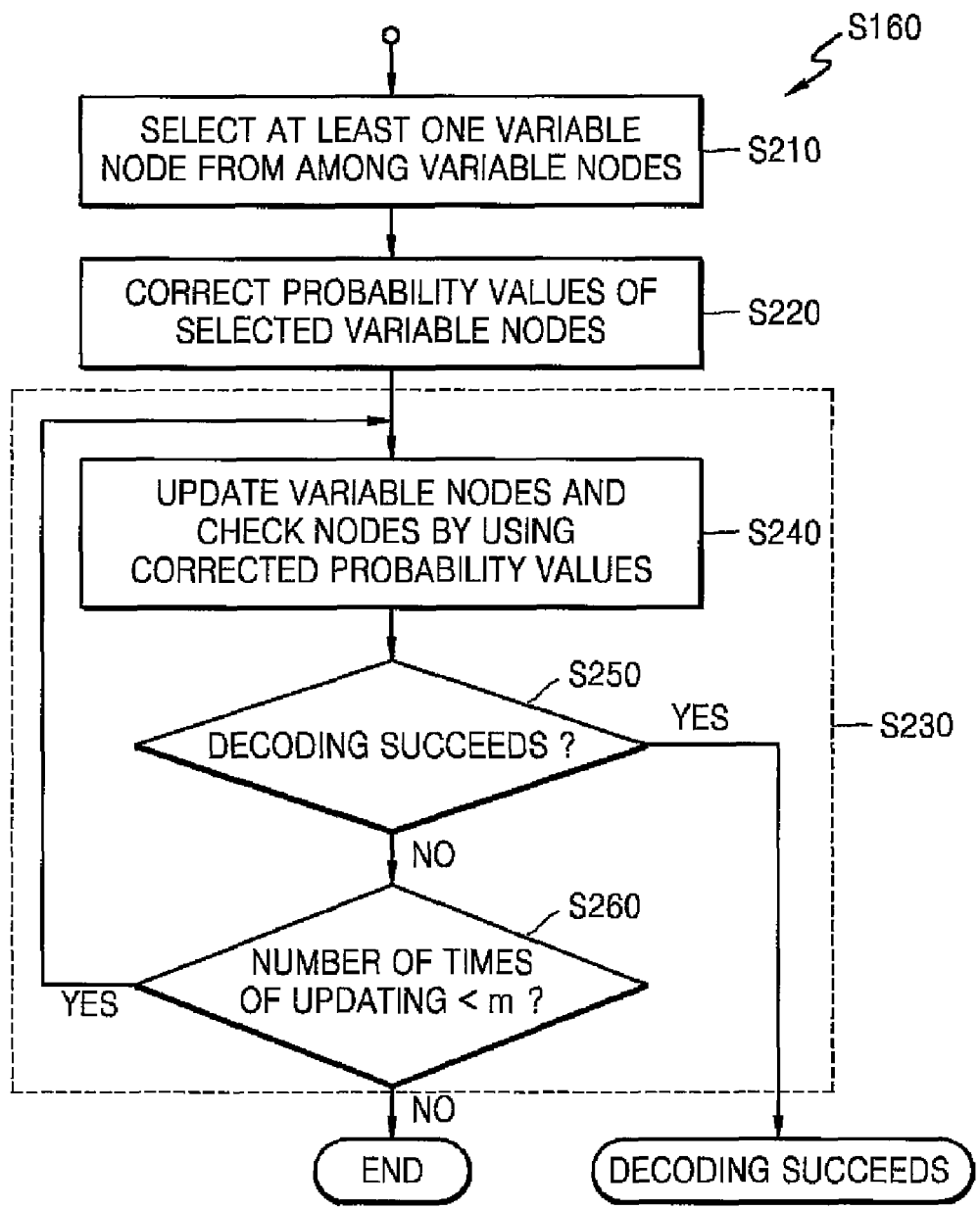
FIG. 2 is a flowchart illustrating a second decoding method of FIG. 1, according to an embodiment of the inventive concept.

FIG. 2 is a flowchart illustrating the second decoding method in operation S160 illustrated in FIG. 1, according to an embodiment of the inventive concept.

Referring to FIGS. 1 and 2, at least one variable node is selected from among the variable nodes in operation S210. For example, at least one variable node having a high probability of generating an error may be selected from among the variable nodes. Selecting of the at least one variable node from among the variable nodes will be described more fully with reference to FIGS. 3 and 4.

When the variable node is selected, probability values of data received in the selected variable nodes are corrected in operation S220. The variable nodes and the check nodes are updated using the corrected probability values, thereby determining whether the decoding succeeds in operation S230. That is, the variable node having a high probability of generating an error is selected and the probability value of data received in the selected variable node is corrected. Then, the decoding is performed again and thus the probability of success in decoding increases. Correcting of the probability value of the selected variable node will be described more fully with reference to FIGS. 3 and 4.

Determining whether the decoding succeeds in operation S230 is substantially the same as performing the first decoding method in operation S120 in FIG. 1, except that the updating operation is performed using the corrected probability value. First, the variable nodes and the check nodes are updated using the corrected probability values in operation S240. For example, the check nodes are updated using the corrected probability values of the related variable nodes during first updating. When the variable nodes are to be updated, the corrected probability values and the values transmitted from the related check nodes are used. As in operation S130, in order to perform the updating, a sum-product decoding algorithm, a min-sum decoding algorithm, or a bit-flipping decoding algorithm may be used, for example. However, the inventive concept is not limited to these algorithms.

After the variable nodes and the check nodes are updated, it is determined in operation S250 whether the decoding is successful. That is, after the variable nodes and the check nodes are updated, whether the decoding is successful is determined using the probability values of the updated variable nodes. When it is determined that the decoding has succeeded, there is no need to perform further decoding and thus the decoding operation is completed. Otherwise, when it is determined that the decoding has failed, it is determined in operation S260 whether the updating has been performed m times (where m is a natural number), where m may be the same as or different from n in operation S150. When the updating has not been performed m times, the process returns to operation S240. When the updating has been performed m times, meaning that the decoding has failed even after the updating has been repeated form times, it is determined that the decoding has failed, and the decoding process ends. Also, when the decoding is successful before performing the updating for m times, it is determined that the decoding has succeeded and the decoding process ends. That is, determining whether the decoding is successful while repeatedly updating the variable nodes and the check nodes, as needed, using the corrected probability values in operation S230 in the second decoding method in operation S160 denotes iterative decoding as described above.

Operations S210 through S230 of FIG. 2 may be performed once. However, if needed, operation S210 through operation S230 may be repeatedly performed. For example, when the decoding fails even if the updating is performed m times, it is determined that the decoding has failed and thus is not completed. Then, the decoding starts again from operation S210 and thus the second decoding may be repeatedly performed. In this case, the at least one variable node having a high probability of generating an error may be selected again from among the variable nodes.

Figure 3:
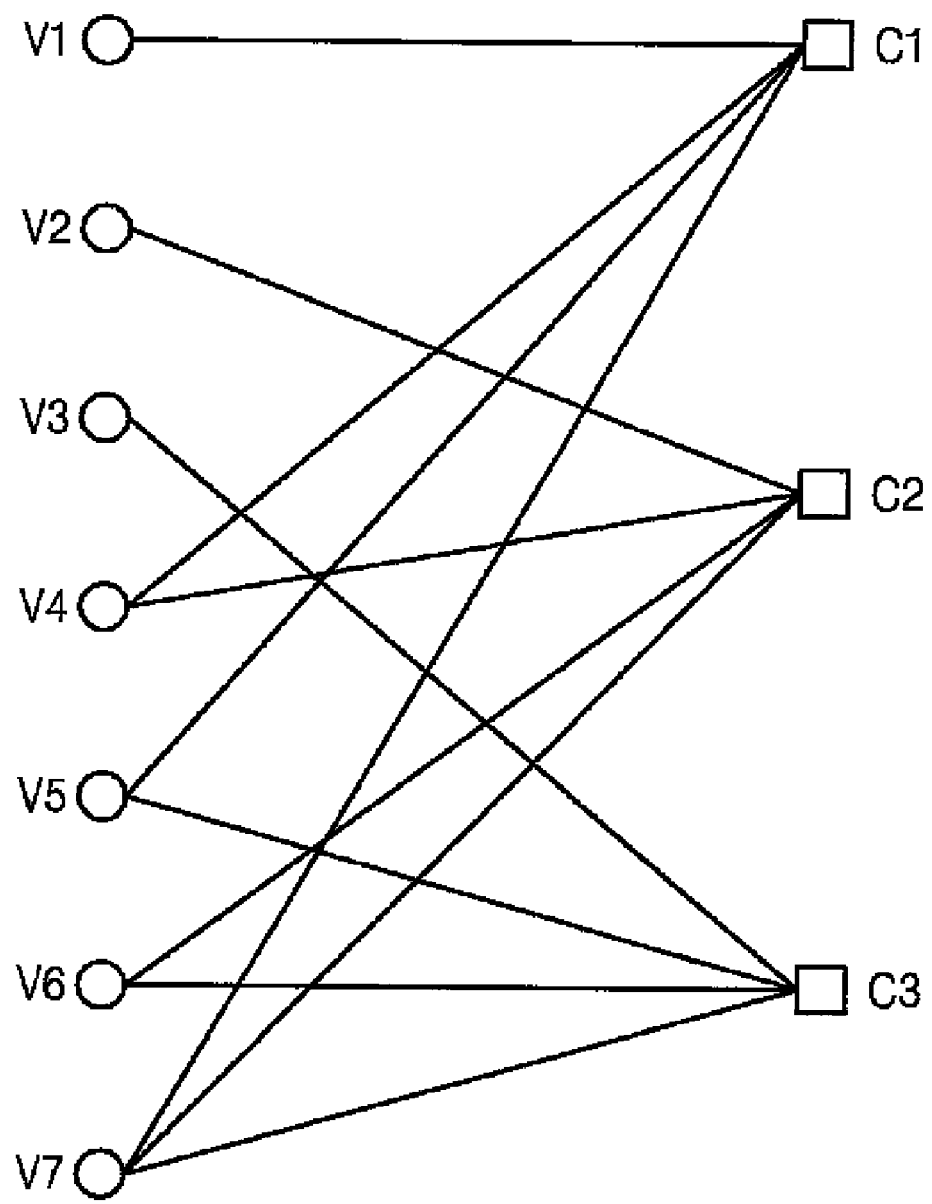
FIG. 3 is a representative bipartite graph for explaining the decoding method, according to an embodiment of the inventive concept.

FIG. 3 is a bipartite graph for explaining the decoding method, according to an embodiment of the inventive concept.

FIG. 4 is a table illustrating a result obtained by performing the first decoding method in operation S120 illustrated in FIG. 1, according to an embodiment of the inventive concept.

Hereinafter, the decoding method according to an embodiment of the inventive concept is described with reference to FIGS. 1 through 4. For purposes of explanation, the bipartite graph includes seven variable nodes V1 through V7 and three check nodes C1 through C3, although the numbers of variable and check nodes may vary.

The probability values received in each of the variable nodes V1 through V7 are the first probability values of each of the variable nodes V1 through V7, respectively. Each of the check nodes C1 through C3 is updated using the probability values of the related variable nodes. Also, each of the variable nodes V1 through V7 is updated using the probability values of the received data and the related check nodes. For example, when the variable node V5 is updated, the check node C1 transmits a value obtained by calculating probability values of the variable nodes V1, V4 and V7 to the variable node V5, and the check node C3 transmits a value obtained by calculating probability values of the variable nodes V3, V6 and V7 to the variable node V5. The probability value of the variable node V5 is determined using the probability value of the received data, the calculated value transmitted from the check node C1, and the calculated value transmitted from the check node C3. The updating method described above would be apparent to one of ordinary skill in the art to which the inventive concept pertains, and thus further description thereof is not included.

Hereinafter, it is assumed that n is 10, and the decoding fails when the updating is performed 10 times.

First, selecting at least one variable node from among the variable nodes V1 through V7 in operation S210 is described.

According to a first embodiment for selecting at least one variable node, when the updating is performed for multiple times in operation S130 during the first decoding method of operation S120, each of the unsatisfied check nodes is counted each time and at least one variable node may be selected from among the variable nodes connected to the unsatisfied checks nodes at the time when the counted number is a minimum. The unsatisfied check nodes denote check nodes having odd numbers of variable nodes, where errors are generated from among the connected variable nodes. For example, as illustrated in FIG. 3, when the variable nodes V1 through V7 are connected to the check nodes C1 through C3 and an error is generated only in the variable node V6, the check nodes C2 and C3 are unsatisfied check nodes.

Referring to FIG. 4, the number and identity of unsatisfied check nodes are shown for each of the 10 times the variable nodes and the check nodes have been updated. In 10 updates, the number of counted unsatisfied check nodes is at a minimum in the third and eighth updates, in which the number of unsatisfied check nodes is one. The check nodes where the errors were generated in the third and eighth updates are C1 and C3, respectively. Referring to FIG. 3, the variable nodes connected to the check node C1 are V1, V4, V5 and V7, and the variable nodes connected to the check node C3 are V3, V5, V6 and V7.

There are a number of methods of selecting the variable nodes. For example, selection methods include selecting all variable nodes connected to all unsatisfied check nodes at all update times for which the counted number of unsatisfied check nodes is a minimum (hereinafter, referred to as "method a"), selecting variable nodes commonly connected to the unsatisfied check nodes at the update times for which the counted number of unsatisfied check nodes is a minimum (hereinafter, referred to as "method b"), selecting variable nodes connected to the unsatisfied check nodes for more than a predetermined number of times at the update times for which the counted number of unsatisfied check nodes is a minimum (hereinafter, referred to as "method c"), and selecting variable nodes connected to all unsatisfied check nodes at the last update time from among the updates times for which the counted number of unsatisfied check nodes is a minimum (hereinafter, referred to as "method d").

According to "method a," variable nodes V1, V3, V4, V5, V6 and V7 are selected in the example depicted in FIGS. 3 and 4. According to "method b," variable nodes V5 and V7 are selected. According to "method c," where the predetermined number of times is once, variable nodes V5 and V7 are selected. According to "method d," the eighth update is the last update time for which the counted number of unsatisfied check nodes is a minimum, so variable nodes V3, V5, V6 and V7 connected to the unsatisfied check node C3 are selected.

According to a second embodiment of selecting variable nodes, the variable nodes are selected based on the number of times the signs of the probability values of the variable nodes V1 through V7 change. Thus, i (where i is a natural number) variable nodes may be selected in order of the highest number of times that the signs are changed, or variable nodes may be selected where the number of times the signs of the probability values of the variable nodes is greater than a predetermined value. For example, for purpose of explanation, it is assumed that the signs of the probability values of variable nodes V1 through V7 change two times (variable node V1), four times (variable node V1), seven times (variable node V3), five times (variable node V4), one time (variable node V5), three times (variable node V6) and six times (variable node V7), respectively, during the 10 updates. According to the second embodiment, when it is assumed that three variable nodes are to be selected (that is, i=3) in order of the highest number of times the signs are changed, three variable nodes V3, V7 and V4 are selected. Alternatively, according to the second embodiment, using a predetermined value of six, for example, variable nodes V3 and V7 are selected since they are the only variable nodes having the number of times the signs of the corresponding probability values change greater than six.

Moreover, instead of the number of times when the signs of the probability values of each of the variable nodes are changed, the number of times when the signs of the probability values of each of the variable nodes are different from the signs of the probability values of initially received data may be used. For example, when the probability values are represented by LLR and the signs of the probability values of the initially received data are positive, the number of times when the probability values of each of the variable nodes are negative may be determined. When the probability values are represented by LR, the number of times when the probability values of each of the variable nodes are changed based on a predetermined value may be used. For example, when the probability values are represented by LR and the probability values of the initially received data are one or above, the number of times when the probability values of each of the variable nodes is changed to less than one may be determined.

According to a third embodiment of selecting variable nodes, the variable nodes are selected based on the probability values of data received in each of the variable nodes V1 through V7 being within a predetermined range. When LLR is used to calculate the probability values, the possibility of errors being generated increases as the probability values become smaller. Also, when LR is used to calculate the probability values, the possibility of errors being generated increases as the LR is closer to one. For example, when LLR is used for the probability values, the predetermined range may be set as −0.1 to 0.1. When the LR is used for the probability values, the predetermine range may be set as $e^{-0.1}$ to $e^{0.1}$. However, the predetermined ranges are not limited to the above ranges and may be changed, as needed.

The variable nodes may be selected using one of the first through third embodiments, or by combining two or more embodiments. For example, various combinations may be used such as "method c" and the third embodiment or "method a" and "method d." When it is assumed that "method b" and the second embodiment are both applied, for example, the variable nodes selected by "method b" and the variable nodes selected by the second embodiment may be all selected or only common variable nodes may be selected. That is, in the case, the variable nodes selected by "method b" are V5 and V7 and the variable nodes selected by the second embodiment are V3, V4 and V7. Thus, all variable nodes V3, V4, V5 and V7 may be selected or the common variable node V7 may be selected.

The first through third embodiments are only examples of ways to select variable nodes and the inventive concept is not limited to these embodiments. Other methods and techniques may be used, as long as at least one variable node having a high probability of generating an error is selected from among the variable nodes.

With regard to correcting the probability values of data received in the selected variable nodes in operation S220, changing the signs of the probability values of the selected variable nodes and changing the size of the probability values of the selected variable nodes may be used. Changing the size of the probability values of the selected variable nodes may include scaling the size of the probability values with a predetermined ratio and changing the probability values to 0 or 1, for example.

When the probability values are represented by LLR, correcting the probability values of the selected variable nodes to 0, changing the signs of the probability values of the selected variable nodes, and changing the size of the probability values of the selected variable nodes using other methods may be used. When the probability values are represented by LR, correcting the probability values of the selected variable nodes to 1, taking the reciprocal of the probability values of the selected variable nodes, and changing the size of the probability values of the selected variable nodes using other methods may be used.

In the above case, when it is assumed that the variable nodes V2 and V6 are selected, the signs or sizes of the probability values of the variable nodes V2 and V6 are changed, and thus the probability values of the variable nodes V2 and V6 may be corrected. The size of the probability values of the variable nodes V2 and V6 may be changed by correcting the probability values of the variable nodes V2 and V6 to 0 or 1, taking the reciprocal of the probability values of the variable nodes V2 and V6, or other methods.

Here, one of above methods is selected to change the probability values of data received in the selected variable nodes, or two or more methods may be applied to change the probability values of data received in the selected variable nodes. For example, the probability values of some of the variable nodes from among the selected variable nodes may be set as 0, and the sizes of the probability values of other variable nodes may be changed. However, the inventive concept is not limited to the above methods and/or combination of methods, and the probability values of data received in the selected variable nodes may be changed in accordance with other methods.

Because the probability values of data received in the selected variable nodes are corrected, each of the check nodes C1 through C3 are updated by using the corrected probability values of the related variable nodes. Also, the variable nodes V1 through V7 are updated using the corrected probability values and values transmitted from the related check nodes. Determining whether decoding succeeds using the updated check nodes C1 through C3 and variable nodes V1 through V7 is described more fully with reference to FIG. 2, and thus the description will not be repeated.

According to embodiments of the inventive concept, n and m may be changed, if needed. For example, for purposes of explanation, it is assumed that the determination of whether the decoding has succeeded includes performing the first decoding method (operation S120) up to 50 times. According to embodiments of the inventive concept, when the first decoding method is performed 50 times, and the second decoding method is performed 50 times (when the first decoding method does not succeed), the time needed for decoding may take twice as long as typically needed. Thus, in order to reduce the time, n and m may be appropriately adjusted, if needed. For example, when the first decoding method is performed 30 times and the second decoding method is performed 20 times, the decoding is performed in same amount of time as typically needed, although the results would be more accurate. Conversely, n and m may be increased in order to improve accuracy, although more time would be required.

Embodiments of the inventive concept more efficiently apply a code, using iterative decoding, where the code using the iterative decoding includes a low density parity check code (LDPC) code, a repeat accumulate (RA) code, and a zigzag code, for example. However, the embodiments of the inventive concept are not limited to these codes, and may be used in decoding of other codes.

Figure 5:
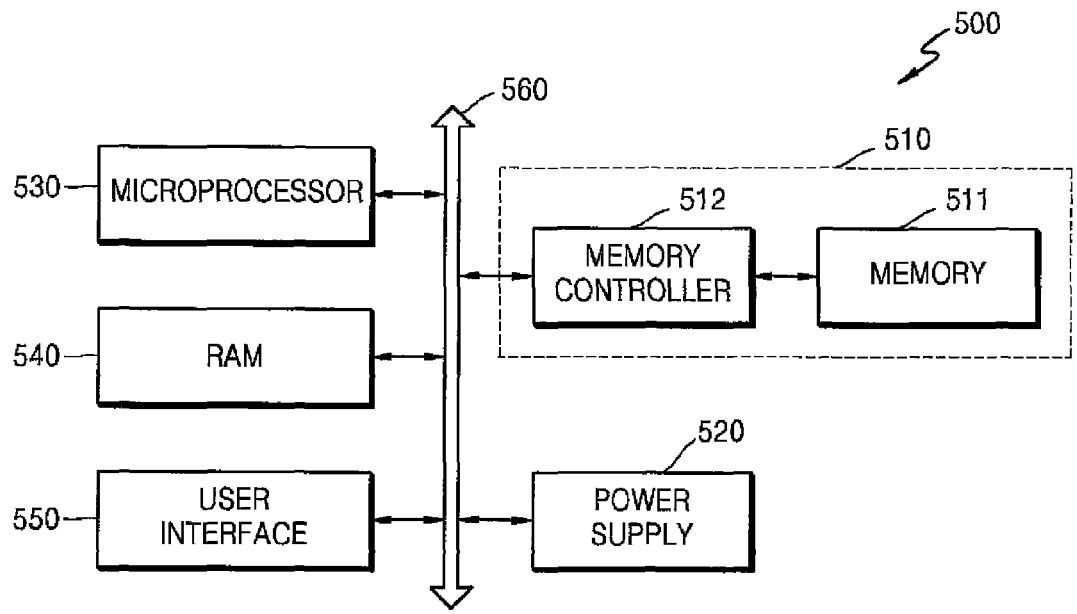
FIG. 5 is a block diagram of a computing system device using the decoding method of FIG. 1, according to an embodiment of the inventive concept.

FIG. 5 is a block diagram of a computing system device 500 using the decoding method of FIG. 1, according to an embodiment of the inventive concept.

Referring to FIG. 5, the computing system device 500 according to the depicted embodiment includes a microprocessor 530, a user interface 550 and a memory system device 510, including a memory controller 512 and a memory device 511, electrically connected to bus 560. The memory controller 512 decodes data read from the memory device 511 using the decoding method according to various embodiments, in order to correct an error, and transmits the data through the bus 560. The computing system device 500 may further include a random access memory (RAM) 540 and a power supply 520.

When the computing system device 500 according to the depicted embodiment is a mobile device, for example, a battery for supplying an operating voltage to the computing system device 500 and a modem, such as a baseband chipset, may be further included. In addition, as would be apparent to one of ordinary skill in the art, an application chipset, a camera image processor (CIS), and/or a mobile DRAM may also be included in the computing system device 500, and thus detailed description thereof will not be included.

The memory controller 512 and the memory 511 may constitute a solid state drive/disk (SSD), for example, in which a non-volatile memory is used to store data.

Figure 6:
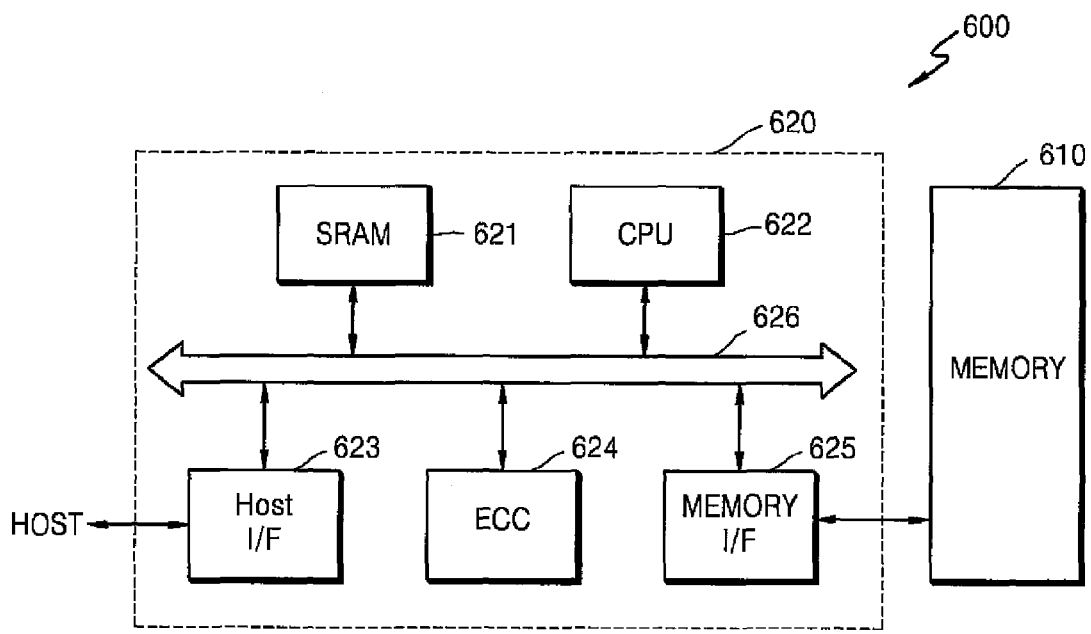
FIG. 6 is a block diagram of a memory card using the decoding method of FIG. 1, according to an embodiment of the inventive concept.

FIG. 6 is a block diagram of a memory card 600 using the decoding method of FIG. 1, according to an embodiment of the inventive concept.

The memory card 600 may include a memory device 610 and a memory controller 620. The memory controller 620 decodes data read from the memory device 610 using the decoding method according to various embodiments, in order to correct an error, and transmits the data through a bus 626. The memory controller 620 may communicate with an external device (for example, a host) through various interface protocols, such as a universal serial bus (USB), a multimedia card (MMC), a Peripheral Component Interconnect Express (PCI-E), a serial advanced technology attachment (SATA), a parallel advanced technology attachment (PATA), a small computer system interface (SCSI), an enhanced small device interface (ESDI), an integrated device electronics (IDE), and the like. The structures and operations of a central processing unit (CPU) 622, a static random access memory (SRAM) 621, a host I/F 623, an ECC 624, a memory I/F 625, and the bus 626 included in the memory controller 620 would be apparent to one of ordinary skill in the art, and thus detailed description thereof will not be included.

The memory device 610 according to the depicted embodiment may be installed by using various forms of packages, such as, for example, package-on-packages (PoPs), ball grid arrays (BGAs), chip scale packages (CSPs), plastic leaded chip carriers (PLCCs), plastic dual in-line packages (PDIPs), die in waffle packs, die in wafer forms, chip on boards (COBs), ceramic dual in-line packages (CERDIPs), metric quad flat packs (MQFPs), thin quad flat packs (TQFPs), small-outline integrated circuits (SOICs), shrink small-outline packages (SSOPs), thin small-outline packages (TSOPs), thin quad flat packs (TQFPs), system in packages (SIPs), multi chip packages (MCPs), wafer-level fabricated packages (WFPs), or wafer-level processed stack packages (WSPs).

While the inventive concept has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A decoding method comprising:
performing a first decoding method comprising updating a plurality of variable nodes and a plurality of check nodes using probability values of received data; and
performing a second decoding method when decoding of the first decoding method fails,
wherein the second decoding method comprises:
selecting at least one variable node from among the plurality of variable nodes;
correcting probability values of data received in the selected at least one variable node;
updating the variable nodes and the check nodes using the corrected probability values; and
determining whether decoding of the second decoding method is successful,
wherein selecting the at least one variable node comprises:
when the updating is performed a plurality of times, counting the number of unsatisfied check nodes at each update time; and
selecting the at least one variable node from among the variable nodes connected to unsatisfied check nodes corresponding to at least one update time having the minimum counted number of unsatisfied check nodes.

2. The method of claim 1, wherein selecting the at least one variable node from among the variable nodes connected to the unsatisfied checks nodes comprises selecting the variable nodes connected to all of the unsatisfied check nodes corresponding to all of the update times having the minimum counted number of unsatisfied check nodes.

3. The method of claim 1, wherein selecting the at least one variable node from among the variable nodes connected to the unsatisfied checks nodes comprises selecting the variable nodes commonly connected to the unsatisfied check nodes corresponding to the update times having the minimum counted number of unsatisfied check nodes.

4. The method of claim 1, wherein selecting the at the least one variable node from among the variable nodes connected to the unsatisfied checks nodes comprises selecting the variable nodes connected to the unsatisfied check nodes corresponding to the update times having the minimum counted number of unsatisfied check nodes for more than a predetermined number of times.

5. The method of claim 1, wherein selecting the at least one variable node from among the variable nodes connected to the unsatisfied checks nodes comprises selecting the variable nodes connected to all of the unsatisfied check nodes corresponding to the last update time from among the update times having the minimum counted number of unsatisfied check nodes.

6. The method of claim 1, wherein correcting the probability values comprises at least one of changing signs of the probability values of the selected variable nodes and changing sizes of the probability values of the selected variable nodes.

7. The method of claim 1, wherein performing the first decoding method comprises:
updating the plurality of variable nodes and the plurality of check nodes using the probability values of the received data;
determining whether the decoding is successful using a result of the updating of the plurality of variable nodes and the plurality of check nodes;
when the decoding is determined to be unsuccessful, determining whether the updating of the plurality of variable nodes and the plurality of check nodes has been performed n times (where n is a natural number); and
when the updating of the plurality of variable nodes and the plurality of check nodes has not been performed n times, again performing the updating of the plurality of variable nodes and the plurality of check nodes using the probability values of the received data.

8. A decoding method comprising:
performing a first decoding method comprising updating a plurality of variable nodes and a plurality of check nodes using probability values of received data; and
performing a second decoding method when decoding of the first decoding method fails,
wherein the second decoding method comprises:
selecting at least one variable node from among the plurality of variable nodes;
correcting probability values of data received in the selected at least one variable node;
updating the variable nodes and the check nodes using the corrected probability values; and
determining whether decoding of the second decoding method is successful, wherein determining whether the decoding of the second decoding method is successful comprises:
  determining whether the decoding is successful using a result of the updating of the variable nodes and the check nodes using the corrected probability values;
  when the decoding is determined to be unsuccessful, determining whether the updating of the plurality of variable nodes and the plurality of check nodes has been performed m times (where m is a natural number);
  when the updating of the plurality of variable nodes and the plurality of check nodes has not been performed m times, again performing the updating of the plurality of variable nodes and the plurality of check nodes using the corrected probability values of the received data; and
  when the updating of the plurality of variable nodes and the plurality of check nodes using the corrected probability values has been performed m times, determining that the decoding has failed.

9. A memory system comprising:
a memory device; and
a memory controller for decoding data read from the memory device using the decoding method of claim 1.

* * * * *